(12) United States Patent
Stamper et al.

(10) Patent No.: US 11,271,079 B2
(45) Date of Patent: Mar. 8, 2022

(54) WAFER WITH CRYSTALLINE SILICON AND TRAP RICH POLYSILICON LAYER

(71) Applicant: GLOBALFOUNDRIES U.S. INC., Santa Clara, CA (US)

(72) Inventors: Anthony K. Stamper, Burlington, VT (US); Steven M. Shank, Jericho, VT (US); John J. Pekarik, Underhill, VT (US); Vibhor Jain, Essex Junction, VT (US); John J. Ellis-Monaghan, Grand Isle, VT (US)

(73) Assignee: GLOBALFOUNDRIES U.S. INC., Malta, NY (US)

( * ) Notice: Subject to any disclaimer, the term of this patent is extended or adjusted under 35 U.S.C. 154(b) by 0 days.

(21) Appl. No.: 16/743,584

(22) Filed: Jan. 15, 2020

(65) Prior Publication Data

US 2021/0217850 A1 Jul. 15, 2021

(51) Int. Cl.
*H01L 29/16* (2006.01)
*H01L 21/02* (2006.01)
*H01L 27/12* (2006.01)
*H01L 21/762* (2006.01)

(52) U.S. Cl.
CPC .... *H01L 29/1604* (2013.01); *H01L 21/02381* (2013.01); *H01L 21/02592* (2013.01); *H01L 21/02595* (2013.01); *H01L 21/02667* (2013.01); *H01L 21/762* (2013.01); *H01L 27/1203* (2013.01)

(58) Field of Classification Search
CPC .......... H01L 29/1604; H01L 21/02595; H01L 21/02592; H01L 21/02667; H01L 21/762; H01L 21/02381; H01L 27/1203
See application file for complete search history.

(56) References Cited

U.S. PATENT DOCUMENTS

| 5,374,564 A | 12/1994 | Bruel |
| 6,177,708 B1 | 1/2001 | Kuang et al. |
| 6,258,688 B1 | 7/2001 | Tsai |
| 8,299,537 B2 | 10/2012 | Greco et al. |

(Continued)

FOREIGN PATENT DOCUMENTS

| KR | 20070118626 | 12/2007 |
| TW | 201703105 | 1/2017 |
| WO | 2016081363 | 5/2016 |

OTHER PUBLICATIONS

Zhao et al., "Power and performance comparision of body bias in 28HPC and back bias in 22FDX", IEEE, 2017, 3 pages.

(Continued)

*Primary Examiner* — Julia Slutsker
(74) *Attorney, Agent, or Firm* — Francois Pagette; Andrew M. Calderon; Roberts Calderon Safran & Cole, P.C.

(57) ABSTRACT

The present disclosure relates to semiconductor structures and, more particularly, to a wafer with crystalline silicon and trap rich polysilicon layer and methods of manufacture. The structure includes: semiconductor-on-insulator (SOI) wafer composed of a lower crystalline semiconductor layer, a polysilicon layer over the lower crystalline semiconductor layer, an upper crystalline semiconductor layer over the polysilicon layer, a buried insulator layer over the upper crystalline semiconductor layer, and a top crystalline semiconductor layer over the buried insulator layer.

17 Claims, 5 Drawing Sheets

(56) References Cited

U.S. PATENT DOCUMENTS

| | | |
|---|---|---|
| 8,466,036 B2 | 6/2013 | Brindle et al. |
| 9,129,800 B2 | 9/2015 | Allibert et al. |
| 9,269,591 B2 | 2/2016 | Kalnitsky et al. |
| 9,923,527 B2 | 5/2018 | McKay |
| 10,192,779 B1 | 1/2019 | Shank et al. |
| 2012/0238070 A1* | 9/2012 | Libbert ............. H01L 21/76251 438/455 |
| 2015/0004778 A1* | 1/2015 | Botula .............. H01L 21/26506 438/510 |
| 2016/0181313 A1 | 6/2016 | Kadono et al. |
| 2018/0096884 A1 | 4/2018 | Shank et al. |
| 2018/0114720 A1* | 4/2018 | Wang ................ H01L 21/02579 |
| 2019/0057868 A1 | 2/2019 | Englekirk et al. |
| 2021/0083058 A1* | 3/2021 | Kadono .................. C30B 25/02 |

OTHER PUBLICATIONS

Taiwanese Office Action and Search Report in TW Application No. 109144121 dated Sep. 22, 2021, 10 pages.

* cited by examiner

WAFER WITH CRYSTALLINE SILICON AND TRAP RICH POLYSILICON LAYER

FIELD OF THE INVENTION

The present disclosure relates to semiconductor structures and, more particularly, to a wafer with crystalline silicon and a trap rich polysilicon region and methods of manufacture.

BACKGROUND

Bulk silicon substrates are less costly than silicon-on-insulator (SOI) substrates. Generally, an SOI substrate includes a thin device layer of silicon, a handle substrate, and a thin buried oxide (BOX) layer, physically separating and electrically isolating the device layer from the handle substrate.

Devices fabricated using SOI technologies may exhibit certain performance improvements in comparison with comparable devices built in a bulk silicon substrate. For example, in contrast to an SOI substrate, a bulk silicon substrate is characterized by poor device isolation from harmonic generation. High resistivity wafers are used for ~1 to 10 GHz rf applications to reduce substrate rf losses.

SUMMARY

In an aspect of the disclosure, a structure comprises: a semiconductor-on-insulator (SOI) wafer comprising a lower crystalline semiconductor layer, a polysilicon layer over the lower crystalline semiconductor layer, an upper crystalline semiconductor layer over the polysilicon layer, a buried insulator layer over the upper crystalline semiconductor layer, and a top crystalline semiconductor layer over the buried insulator layer.

In an aspect of the disclosure, a structure comprises: a wafer composed of a trap rich polysilicon layer and a crystalline semiconductor material above the trap rich polysilicon layer; a buried oxide layer on a surface of the crystalline semiconductor material; and a crystalline semiconductor layer over the buried oxide layer.

In an aspect of the disclosure, a method comprising: forming a trap rich portion in a wafer under a single crystalline portion; forming an insulator layer over the single crystalline portion, the single crystalline portion providing a separation between the trap rich portion and the insulator layer; and forming a semiconductor layer over the insulator layer.

BRIEF DESCRIPTION OF THE DRAWINGS

The present disclosure is described in the detailed description which follows, in reference to the noted plurality of drawings by way of non-limiting examples of exemplary embodiments of the present disclosure.

DETAILED DESCRIPTION

The present disclosure relates to semiconductor structures and, more particularly, to a wafer with crystalline silicon and trap rich polysilicon layer and methods of manufacture. More specifically, the present disclosure provides a silicon on insulator (SOI) wafer with crystalline silicon that separates a trap rich polysilicon layer from a buried oxide layer and methods of manufacture. Advantageously, the present disclosure provides improved linearity for a field effect transistor, amongst other advantages.

In embodiments, the wafer is substrate on insulator (SOI) technology. The wafer includes a thin silicon layer, a buried oxide layer, and a single crystalline silicon handle wafer with a trap rich polysilicon layer. The thin silicon layer can be a single crystalline material, e.g., single crystalline silicon. The silicon layer and single crystalline silicon can also be composed of other single crystalline substrate materials. The trap rich polysilicon layer is under and separated from the buried oxide layer. In further embodiments, the crystalline silicon under the buried oxide layer can be for a FET or NPN body contact and the trap rich polysilicon layer will provide improved linearity.

In more specific embodiments, the structure comprises a substrate and a trap rich layer. A first crystalline layer is provided over the trap rich layer, with a dielectric layer (e.g., buried oxide layer) over the first crystalline layer. The first crystalline layer will provide separation between the trap rich layer and the dielectric layer. A second crystalline layer is provided over the buried dielectric layer, thereby forming a SOI wafer with the trap rich layer separated from the buried oxide layer. In embodiments, the first and second crystalline layers can be single crystalline Si and the buried dielectric layer can be oxide material. And, in embodiments, the trap rich layer contains a polysilicon crystalline material.

The structures of the present disclosure can be manufactured in a number of ways using a number of different tools. In general, though, the methodologies and tools are used to form structures with dimensions in the micrometer and nanometer scale. The methodologies, i.e., technologies, employed to manufacture the structures of the present disclosure have been adopted from integrated circuit (IC) technology. For example, the structures are built on wafers and are realized in films of material patterned by photolithographic processes on the top of a wafer. In particular, the fabrication of the structures uses three basic building blocks: (i) deposition of thin films of material on a substrate, (ii) applying a patterned mask on top of the films by photolithographic imaging, and (iii) etching the films selectively to the mask.

Figure 1:
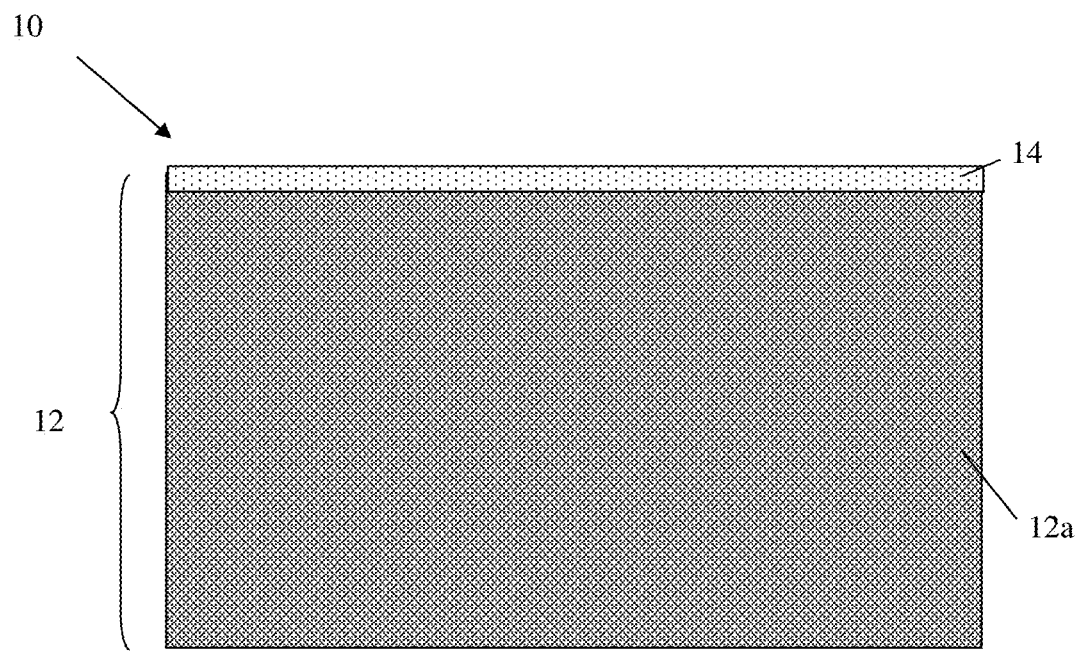
FIG. 1 shows a wafer in accordance with aspects of the present disclosure.

FIG. 1 shows a wafer in accordance with aspects of the present disclosure. More specifically, the structure 10 of FIG. 1 includes a handle wafer 12 used as a front end module, and which, in an exemplary embodiment, has a high resistivity for RF device applications. For example, the resistivity of the wafer 12 can be high resistivity, such as but not limited to 1000 ohm-cm or greater. The wafer 12 can be composed of a single crystalline material 12a. For example, the single crystalline material 12a can be a single crystalline Si material. In further embodiments, the single crystalline material 12a can be other single crystalline semiconductor materials such as, e.g., SiGe, SiC, Ge, etc., and can be optionally bonded to glass or sapphire (also represented by reference numeral 12a). An optional layer of oxide material 14 can be formed on the wafer 12. In embodiments, the optional oxide material 14 can have a thickness of about 50 nm, as an example, and can be formed with a thermal oxidization, for example, formed using a 1000° C. oxidization in a furnace.

Figure 2:
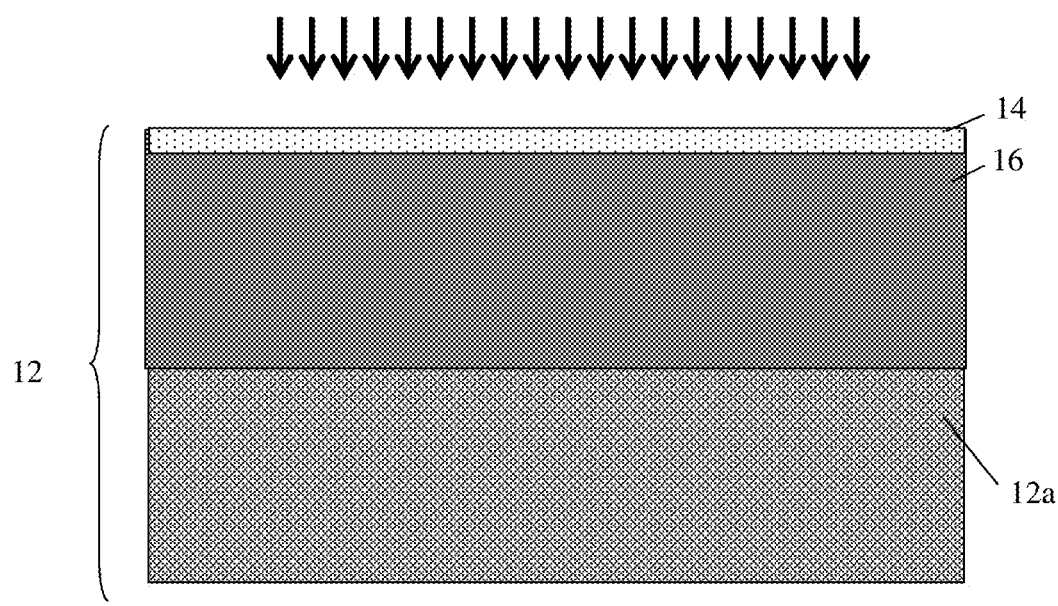
FIG. 2 shows an amorphous region in the wafer, amongst other features, and respective fabrication processes in accordance with aspects of the present disclosure.

FIG. 2 shows an amorphous region 16 extending into the wafer 12. In embodiments, the amorphous region 16 is composed of, e.g., amorphous Si, on a surface of the wafer 12 and which extends to within a certain depth thereof. The amorphous region 16 is fabricated by amorphizing the substrate 12 using an implant process, which is below a critical dose that prevents recrystallization of the wafer 12, e.g., single crystalline material 12a. In embodiments, the amorphous region 16 can be implanted through a coating, e.g., oxide material 14, or on a bare surface of the wafer 12. The implant process, in embodiments, can be an argon implant process at a dosage level of 1E14 to 1.5 E15, and in more preferable embodiments, 1.25 E15. The implant can use argon or other implant elements, e.g., other inert gases such as other noble gases such as xenon, germanium, nitrogen or oxygen, etc. In embodiments, the amorphous region 16 has a crystalline silicon layer a few 10's of nm thick on its surface which, during subsequent annealing steps, forms the seed crystal for the amorphous silicon recrystallization.

Figure 3:
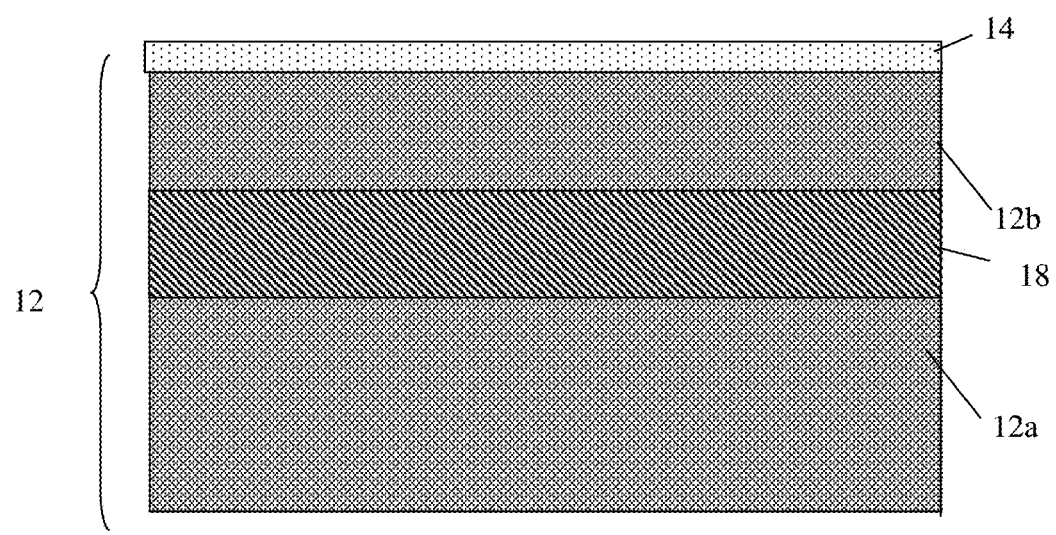
FIG. 3 shows a recrystallized portion of the wafer, amongst other features, and respective fabrication processes in accordance with aspects of the present disclosure.

In FIG. 3, the wafer 12 is subjected to a rapid thermal anneal process to recrystallize the surface of the wafer 12, forming a single crystalline region 12b at the surface of the wafer 12. The rapid thermal anneal process will also leave one or more polysilicon or trap rich polysilicon layers 18 under the recrystallized region (layer) 12b. It should be understood by those of skill in the art that the trap rich polysilicon layer 18 will advantageously provide improved linearity and will be capable of pinning back a gate bias. The rapid thermal anneal process can be at a temperature of between 900° C. to 1150° C. from 0 to 10 seconds. In embodiments, the thermal anneal process is a spike anneal (e.g., 0 seconds) at 1000° C. In embodiments, the polysilicon or trap rich polysilicon layer is 10 nm to 500 nm thick and, in one embodiment, is 50 nm thick.

Figure 4:
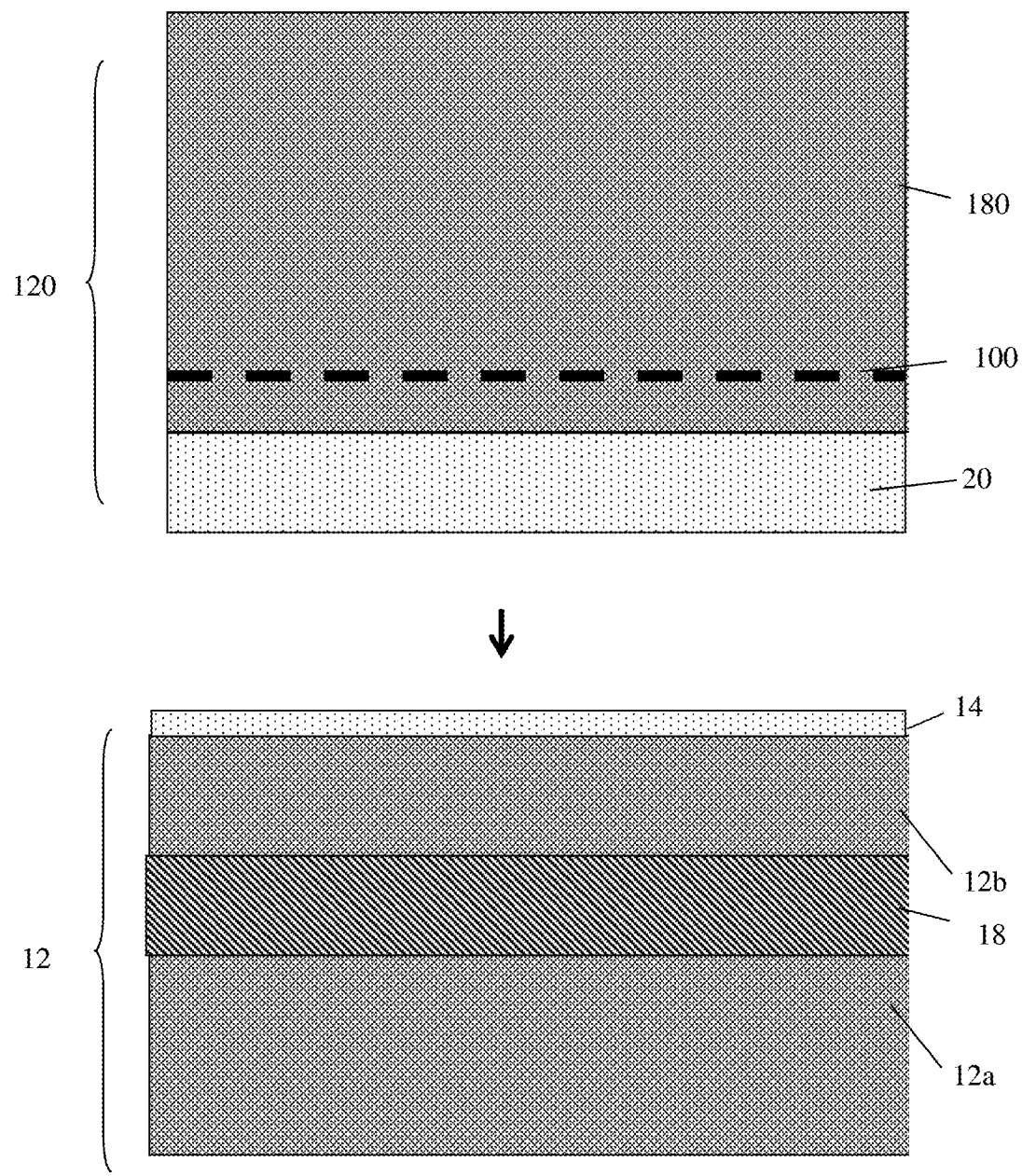
FIG. 4 shows formation of a substrate on insulator technology, amongst other features, and respective fabrication processes in accordance with aspects of the present disclosure.

As shown in FIG. 4, a silicon wafer 120 is shown with the wafer of FIG. 3. The silicon wafer 120 includes a silicon layer 180 with an oxidized lower surface layer 20 formed, for example, by a 1000° C. thermal oxidization to a thickness of 0.1 to 5 microns and, in one embodiment, to a thickness of 0.4 micron (although other dimensions are contemplated herein). The wafer 120 includes a hydrogen implanted layer 100, which is a few 10's or 100's of nm below the lower surface as known in the art. As shown representatively by the arrow, the wafer 120 is bonded to wafer 12. The wafer 120 is then separated along the hydrogen implanted region 100 using, for example, a Smartcut™ process as is known in the art, followed by planarizing process as known in the art resulting in the structure shown representatively in FIG. 5. Processes for forming the wafer are further shown in, e.g., U.S. Pat. No. 5,374,564, which is incorporated by reference herein in its entirety.

Figure 5:
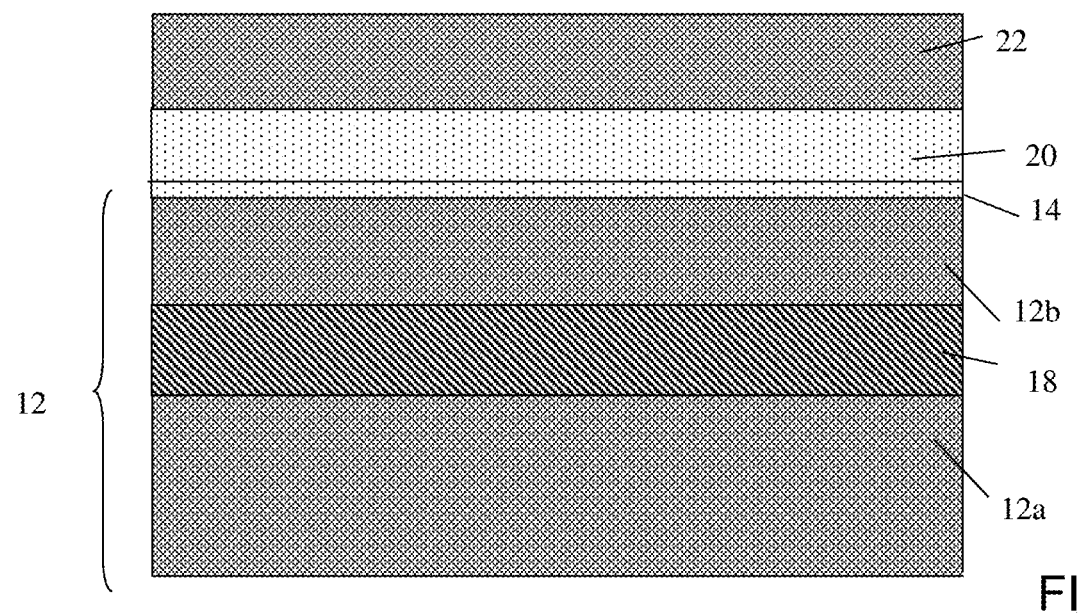
FIG. 5 shows the substrate on the insulator technology with a single crystalline substrate separated from a polysilicon layer, amongst other features, and respective fabrication processes in accordance with aspects of the present disclosure.

Referring to FIG. 5, it should be understood that the insulator layers 14 and 20 will form a buried oxide layer (BOX) in the completed wafer as shown in FIG. 5. Oxides 14 and 20, although drawn separately in the figures, would merge into a single oxide layer during the layer 20 oxidization step. Alternatively, the oxide layer 14 could be omitted and the BOX layer would be formed solely using oxide layer 20. If this is the case, then oxide layer 20 could be formed on either the wafer (e.g., donor wafer) 120 or the wafer (e.g., acceptor wafer) 12.

Moreover, as shown in FIG. 5, after the wafer 120 is separated along the hydrogen implanted region 100, it will form the substrate 22 now bonded to the insulator layers 14, 20, e.g., which forms the upper portion of the SOI technology. The substrate 22 can be single crystalline Si or other suitable single crystalline semiconductor material as described herein as examples. In this way, the wafer is now a silicon-on-insulator (SOI) substrate, with the trap rich polysilicon layer 18 underneath the recrystallized region 12b and separated from the oxide layer 14/20 by the recrystallized region 12b. That is, the recrystallized region 12b is an intervening layer, which prevents direct contact between the trap rich polysilicon layer 18 and the insulator layer 20, e.g., BOX. There is also a crystalline bottom layer, e.g., single crystalline Si layer 12a, under the trap rich polysilicon layer 18.

Figure 6:
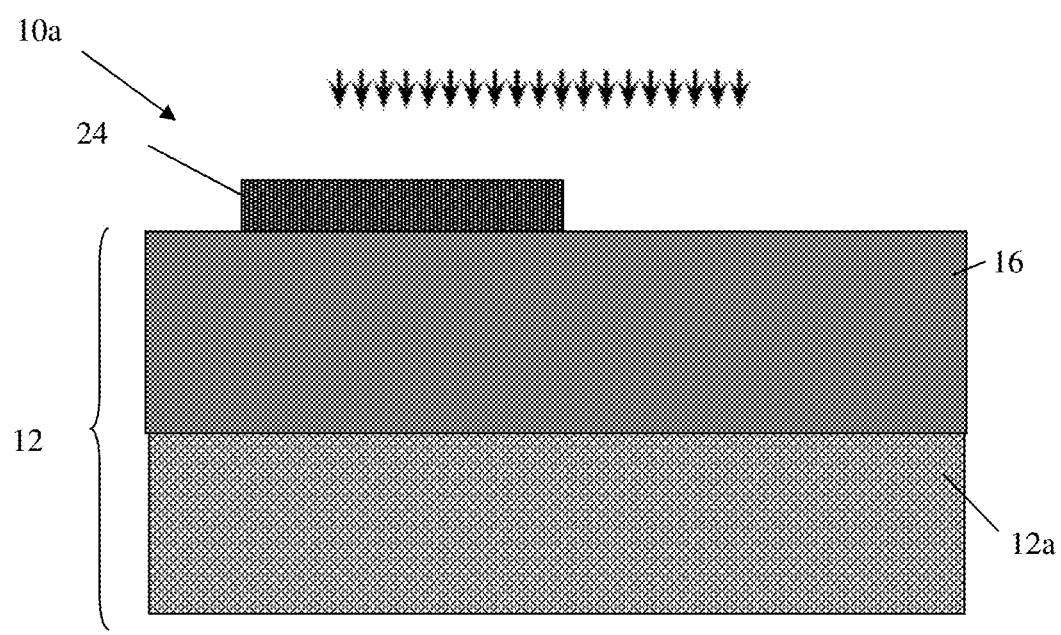
FIGS. 6-8 show a wafer and respective fabrication processes in accordance with additional aspects of the present disclosure.
Figure 7:
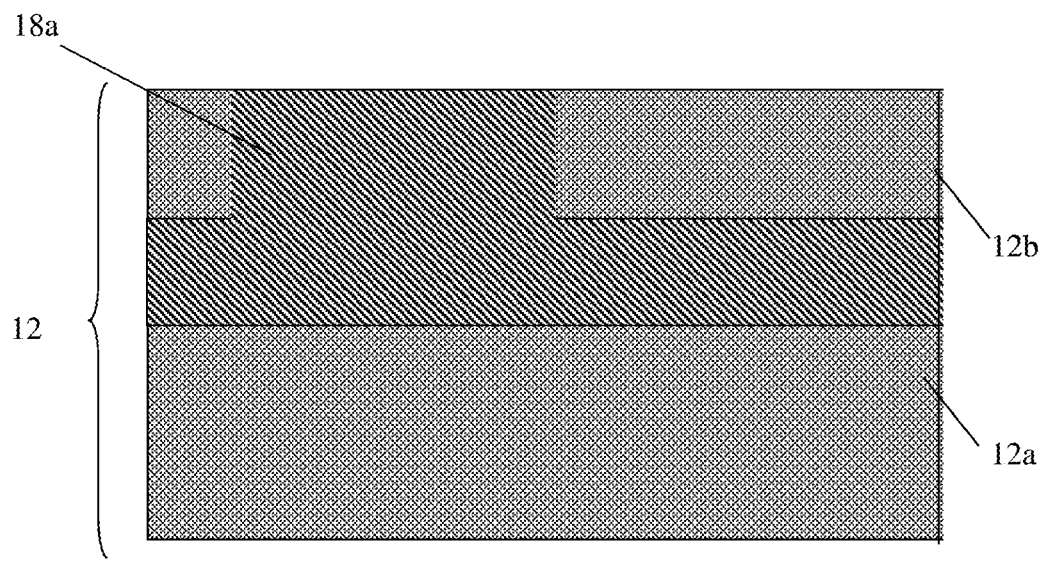
Figure 8:
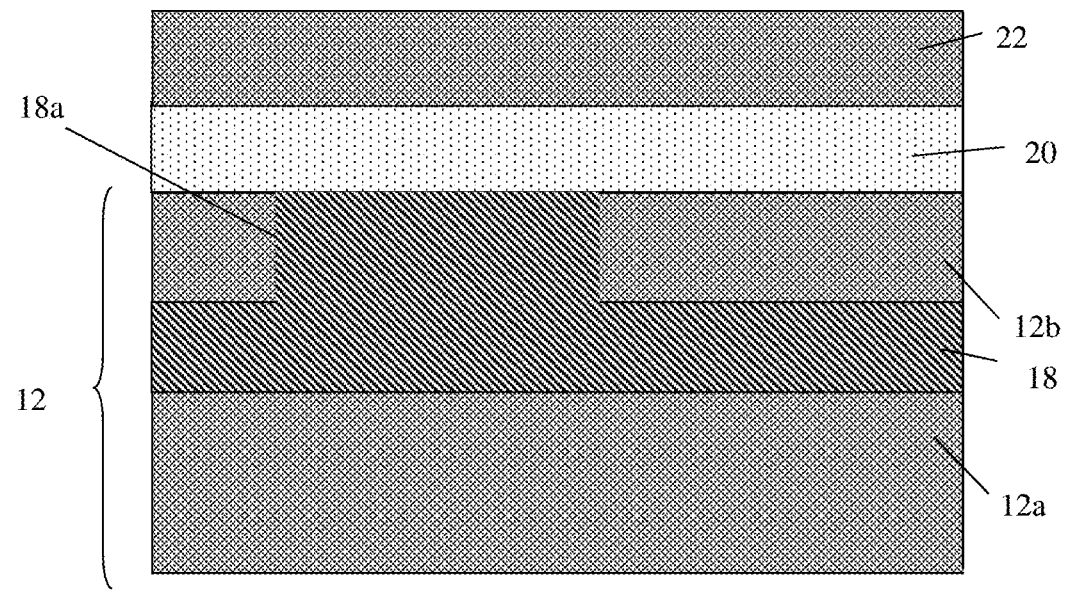

FIGS. 6-8 show a wafer and respective fabrication processes in accordance with additional aspects of the present disclosure with the trap rich polysilicon region 18, 18a extending to the handle wafer 12 surface in region 18a. More specifically, the structure 10a shown in FIG. 6 includes a patterned material 24 over the wafer 12. In embodiments, the patterned material 24 is an oxide material that is deposited and patterned prior to an implant process (as represented by the arrows). The patterning is a conventional lithography and etching process. For example, after the deposition of the oxide material 24, a resist formed over the oxide material 24 is exposed to energy (light) to form a pattern (opening). An etching process with a selective chemistry, e.g., reactive ion etching (RIE), will be used to remove oxide material through the opening, leaving the pattern of oxide material 24 shown in FIG. 6. The resist can then be removed by a conventional oxygen ashing process or other known stripants. Following the patterning process, the fabrication methods continue with the implant process as already described herein, with the difference that the oxide material 24 will block some of the implants into the wafer 12.

In FIG. 7, the oxide material is removed by conventional etching processes using a selective chemistry. The wafer 12 is subjected to a rapid thermal anneal process to recrystallize the surface of the wafer 12, forming a single crystalline region 12b at the surface of the wafer 12 and a trap rich polysilicon layer 18a underneath and adjacent to the single crystalline region 12b.

In this embodiment, the rapid thermal anneal process will leave a trap rich polysilicon extension region 18a extending to the surface of the recrystallized surface 12b, with a pattern corresponding to that of the patterned oxide material. The trap rich polysilicon extension region 18a is also surrounded by the single crystalline region 12b, with a portion contacting the buried oxide layer 20 (see FIG. 8) and remaining portions separated from the buried oxide layer 20 by the single crystalline region 12b. The rapid thermal anneal process can be at a temperature of between 900° C. to 1150° C. from 0 to 10 seconds. In embodiments, the thermal anneal process is a spike (e.g., 0 seconds) at 1000° C.

As shown in FIG. 8, an insulator or dielectric layer (e.g., oxide) 20 is deposited over the wafer 12 and, more specifically, over the recrystallized region 12b and the trap rich polysilicon layer 18a extending to the surface of the recrystallized region 12b. The layer 20 can be formed by any conventional suitable process, such as separation by implantation of oxygen (SIMOX), deposition, thermal oxidation and/or other suitable process.

Still referring to FIG. 8, the substrate 22 is deposited over the layer 20. The substrate 22 can be single crystalline Si or other suitable single crystalline substrate as described herein. In embodiments, the substrate 22 can be bonded directly to the oxide layer 20, e.g., BOX, or can first be bonded to a separate oxide material which, in turn, is bonded to the layer 20 using wafer bonding, and/or other suitable methods as described herein. In this way, the wafer is now a silicon-on-insulator (SOI) substrate, with a trap rich polysilicon layer 18, 18a underneath and surrounded by the recrystallized region 12b and partly separated from the oxide layer 18 by the recrystallized region 12b.

The wafers described herein can be utilized in system on chip (SoC) technology. It should be understood by those of skill in the art that SoC is an integrated circuit (also known as a "chip") that integrates all components of an electronic system on a single chip or substrate. As the components are integrated on a single substrate, SoCs consume much less power and take up much less area than multi-chip designs with equivalent functionality. Because of this, SoCs are becoming the dominant force in the mobile computing (such as in Smartphones) and edge computing markets. SoC is also commonly used in embedded systems and the Internet of Things.

The method(s) as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A structure comprising a semiconductor-on-insulator (SOI) wafer comprising a lower crystalline semiconductor layer, a polysilicon layer over the lower crystalline semiconductor layer, an upper crystalline semiconductor layer over the polysilicon layer, a buried insulator layer over the upper crystalline semiconductor layer, and a top single crystalline semiconductor layer over the buried insulator layer, wherein the lower crystalline semiconductor layer comprises single crystalline silicon and the polysilicon layer is trap rich which includes an extension portion surrounded on its sides with the single crystalline silicon.

2. The structure of claim 1, wherein the buried insulator layer is a buried oxide layer, the lower crystalline semiconductor layer is single crystalline silicon and the upper crystalline semiconductor layer is single crystalline silicon.

3. The structure of claim 2, wherein the single crystalline silicon is high resistivity silicon>1000 ohm-cm.

4. The structure of claim 1, wherein the upper crystalline semiconductor layer separates the polysilicon layer from the buried insulator layer.

5. The structure of claim 1, wherein the lower crystalline semiconductor layer and the upper crystalline semiconductor layer is a handle wafer and the polysilicon layer is embedded within the handle wafer between the lower crystalline semiconductor layer and the upper crystalline semiconductor layer.

6. The structure of claim 1, wherein the extension portion extends to a surface of the upper crystalline semiconductor layer and contacts a portion of the buried insulator layer.

7. A structure comprising:
a wafer composed of a trap rich polysilicon layer and a crystalline semiconductor material above the trap rich polysilicon layer;
a buried oxide layer on a surface of the crystalline semiconductor material; and
a crystalline semiconductor layer over the buried oxide layer, wherein
the crystalline semiconductor material is single crystalline material, and
an extension portion of the trap rich polysilicon layer is surrounded on its sides with the single crystalline semiconductor material of the wafer.

8. The structure of claim 7, wherein the crystalline semiconductor material above the trap rich polysilicon layer isolates the trap rich polysilicon layer from the buried oxide layer.

9. The structure of claim 7, wherein the crystalline semiconductor layer are single crystalline material.

10. The structure of claim 9, wherein the single crystalline material is single crystalline Si based material.

11. The structure of claim 10, wherein the wafer, the buried oxide layer and the crystalline semiconductor layer is semiconductor on insulator (SOI) technology.

12. The structure of claim 10, wherein the wafer is a handle wafer and the trap rich polysilicon layer is embedded within the handle wafer.

13. The structure of claim 12, wherein the single crystalline substrate material is above and below the trap rich polysilicon layer.

14. The structure of claim 7, wherein the trap rich polysilicon layer includes the extension portion extending to a surface of the single crystalline portion above it, and contacts a portion of the buried oxide layer.

15. A method comprising:
forming a trap rich polysilicon layer in a wafer under a single crystalline semiconductor material;
forming an insulator layer over the single crystalline semiconductor material, the single crystalline semiconductor material providing a separation between the trap rich polysilicon layer and the insulator layer; and
forming a crystalline semiconductor layer over the insulator layer; and
forming an extension portion of the trap rich polysilicon layer surrounded on its sides with the single crystalline of the wafer.

16. The method of claim 15, wherein forming of the trap rich polysilicon layer and the single crystalline semiconductor material comprises amorphizing the single crystalline semiconductor material followed by a rapid thermal anneal process.

17. The method of claim 16, wherein the amorphizing is an implant process using an inert gas below a critical dose that prevents recrystallization of a wafer and the rapid thermal anneal process recrystallizes the wafer to form the single crystalline semiconductor material above the trap rich portion.

* * * * *